United States Patent
Yang et al.

(10) Patent No.: US 10,910,451 B2
(45) Date of Patent: Feb. 2, 2021

(54) METHOD FOR FABRICATING FLEXIBLE DISPLAY SUBSTRATE

(71) Applicant: BOE Technology Group Co., Ltd., Beijing (CN)

(72) Inventors: Jing Yang, Beijing (CN); Mingche Hsieh, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/457,261

(22) Filed: Jun. 28, 2019

(65) Prior Publication Data

US 2020/0066812 A1 Feb. 27, 2020

(30) Foreign Application Priority Data

Aug. 24, 2018 (CN) .......................... 2018 1 0974575

(51) Int. Cl.
*H01L 27/32* (2006.01)
*H01L 51/00* (2006.01)

(52) U.S. Cl.
CPC ...... *H01L 27/3244* (2013.01); *H01L 51/0097* (2013.01); *H01L 2227/323* (2013.01); *H01L 2227/326* (2013.01)

(58) Field of Classification Search
CPC .......................... H01L 51/0097; H01L 51/003
See application file for complete search history.

(56) References Cited

U.S. PATENT DOCUMENTS

| | | | |
|---|---|---|---|
| 7,611,965 B2 | 11/2009 | Suzuki et al. | |
| 7,745,252 B2 | 6/2010 | Suzuki et al. | |
| 8,530,253 B2 | 9/2013 | Shin et al. | |
| 8,900,970 B2 | 12/2014 | Maruyama et al. | |
| 9,184,221 B2 | 11/2015 | Jinbo et al. | |
| 9,859,525 B2 | 1/2018 | Hsieh et al. | |
| 10,134,904 B2 | 11/2018 | Adachi et al. | |
| 2008/0292786 A1 | 11/2008 | Hatano et al. | |
| 2009/0075456 A1* | 3/2009 | Akimoto ........... | H01L 21/76254 438/458 |

(Continued)

FOREIGN PATENT DOCUMENTS

| CN | 1870844 A | 11/2006 |
|---|---|---|
| CN | 1925140 A | 3/2007 |
| CN | 1925187 A | 3/2007 |

(Continued)

OTHER PUBLICATIONS

First Office Action dated Mar. 16, 2020, for corresponding Chinese application 201810974575.1.

*Primary Examiner* — Jay C Chang
*Assistant Examiner* — Mikka Liu
(74) *Attorney, Agent, or Firm* — Nath, Goldberg & Meyer; Joshua B. Goldberg

(57) ABSTRACT

A method for fabricating a flexible display substrate is provided. The method includes: forming a separation structure on a rigid substrate such that the separation structure includes a first separation layer and a second separation layer; forming a flexible substrate on the separation structure; forming a display element on the flexible substrate; and separating the first separation layer and the second separation layer of the separation structure mechanically to separate the rigid substrate from the flexible substrate.

20 Claims, 5 Drawing Sheets

(56) References Cited

U.S. PATENT DOCUMENTS

2016/0114522 A1* 4/2016 Asakawa ........... B23K 26/0676
                                              264/400

FOREIGN PATENT DOCUMENTS

| CN | 101064247 A | 10/2007 |
| CN | 101311789 A | 11/2008 |
| CN | 102456712 A | 5/2012 |
| CN | 103779390 A | 5/2014 |
| CN | 104103677 A | 10/2014 |
| JP | 2015167135 A | 9/2015 |

* cited by examiner

METHOD FOR FABRICATING FLEXIBLE DISPLAY SUBSTRATE

CROSS-REFERENCE TO RELATED APPLICATIONS

The present application claims the priority of the Chinese Patent Application No. 201810974575.1, filed on Aug. 24, 2018, the contents of which are incorporated herein in their entirety by reference.

TECHNICAL FIELD

The present disclosure relates to the field of display technology, and in particular to a method for fabricating a flexible display substrate.

BACKGROUND

When fabricating a flexible OLED display device, a flexible substrate is usually attached to a rigid substrate, such as a glass substrate, and then subsequent display elements, such as a TFT, an organic light-emitting layer, an encapsulation layer and the like, are fabricated. After the above process of fabricating the display elements is completed, the flexible substrate and the glass substrate may be separated from each other by a laser to obtain a flexible display product.

SUMMARY

The present disclosure provides a method for fabricating a flexible display substrate, including steps of: forming a separation structure on a rigid substrate, the separation structure includes a first separation layer and a second separation layer, the first separation layer being formed closer to the rigid substrate than the second separation layer; forming a flexible substrate on the separation structure; forming a display element on the flexible substrate; and separating the first separation layer and the second separation layer of the separation structure from each other mechanically to separate the rigid substrate from the flexible substrate.

In an embodiment, the step of forming the separation structure on the rigid substrate includes: forming the first separation layer on the rigid substrate; and oxidizing a surface of the first separation layer distal to the rigid substrate to form the second separation layer.

In an embodiment, the first separation layer is a molybdenum metal layer, and the second separation layer is a molybdenum oxide layer.

In an embodiment, the molybdenum oxide layer has a thickness in a range of 10 to 100 angstroms.

In an embodiment, the step of forming the flexible substrate on the separation structure includes: forming an adjustment layer on the second separation layer, and forming a flexible substrate on the adjustment layer.

In an embodiment, the adjustment layer is made of an inorganic insulating material.

In an embodiment, the inorganic insulating material includes silicon oxide or silicon nitride.

In an embodiment, the adjustment layer has a thickness in a range of 10 to 800 angstroms.

In an embodiment, the step of separating the first separation layer and the second separation layer of the separation structure from each other mechanically includes generating a cut by a laser such that the cut extends along a direction perpendicular to the rigid substrate, and applying a pulling force at the cut to separate the first separation layer from the second separation layer.

In an embodiment, before the step of oxidizing the surface of the first separation layer distal to the rigid substrate to form the second separation layer, the method further including: patterning the first separation layer such that an orthographic projection of the flexible substrate on the rigid substrate falls within an orthographic projection of the patterned first separation layer to the rigid substrate.

In an embodiment, the flexible substrate is made of an organic material.

In an embodiment, the flexible substrate is formed by coating a polyimide solution.

In an embodiment, the flexible substrate has a thickness in a range of 10 to 20 μm.

In an embodiment, the flexible display substrate is a flexible OLED display substrate, and the step of forming a display element on the flexible substrate includes: forming a TFT array structure, an organic light emitting device, and an encapsulation layer on the flexible substrate.

In an embodiment, after the step of separating the first separation layer and the second separation layer of the separation structure from each other mechanically to separate the rigid substrate from the flexible substrate, the method further includes: attaching a protective film to a side of the flexible substrate facing away from the display elements.

DETAILED DESCRIPTION

For better understanding of technical solutions of the present disclosure by those skilled in the art, the present disclosure will be further described in detail below in conjunction with the drawings and specific embodiments.

As described above, during preparation of the flexible OLED display device, when a flexible substrate and a glass substrate are separated from each other by a laser, there may be a problem. Specifically, in a process of fabricating a TFT, an organic light-emitting layer, and an encapsulation layer, particles or organic substances that cannot be cleaned may be left on a back side of the glass substrate. Therefore, in a separation process by the laser, the particles or organic substances would block the laser beam when the laser beam is directed to the back side of the glass substrate, so that laser energy received by a portion of the substrate corresponding to the particles is low, while adhesion to the glass substrate of the particles is not reduced. In this case, if a strong mechanical force is used to separate particles or organic substances from the glass substrate, a functional layer on the flexible substrate would easily be broken, resulting in poor display quality of the product. Further, if the laser energy is increased for separation, excessive laser irradiation may cause damage to the TFT device on the flexible substrate, lowering an electrical performance of the TFT.

Figure 1A:
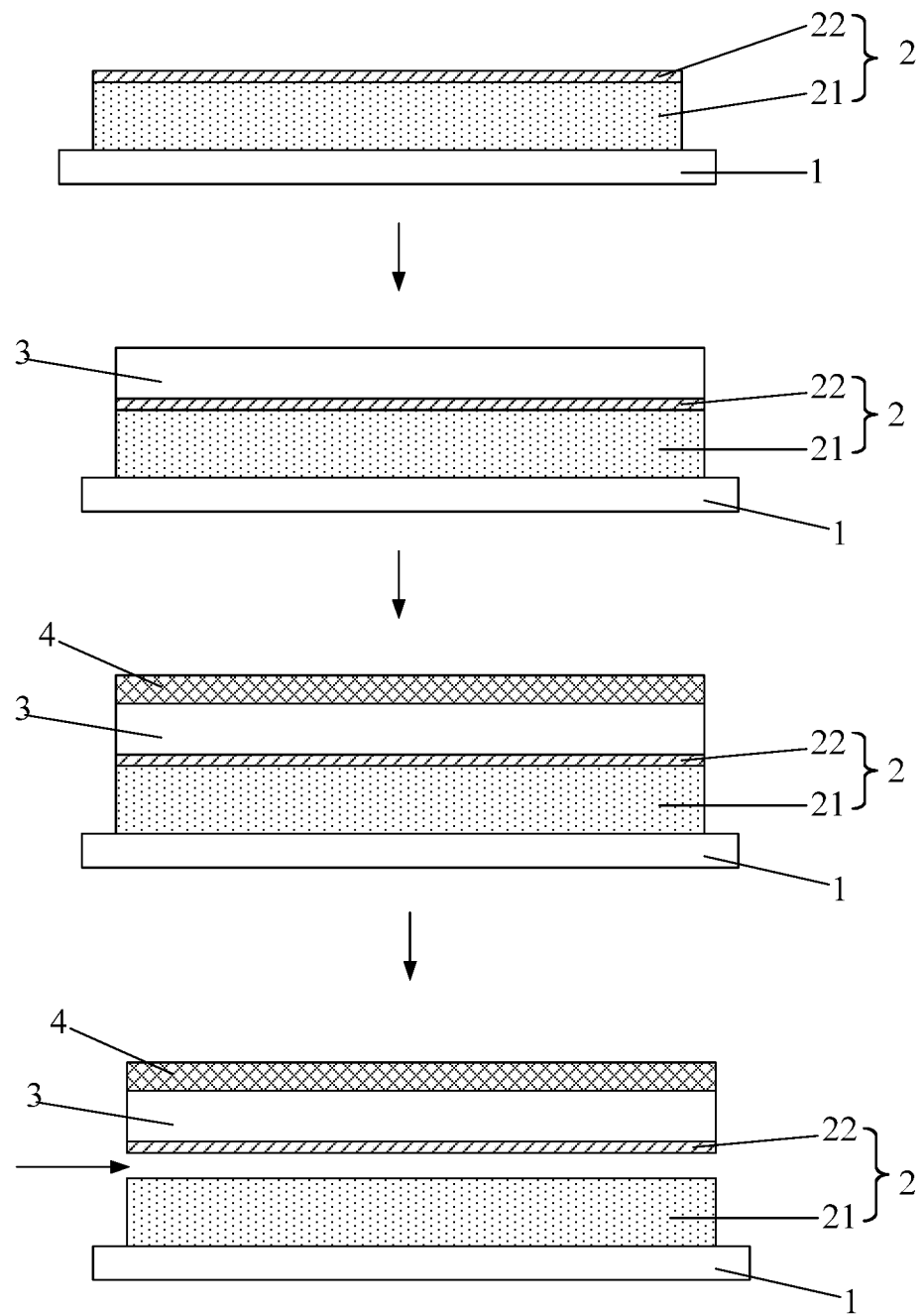
FIG. 1A is a schematic view illustrating a method for fabricating a flexible display substrate according to an embodiment of the present disclosure.
Figure 1B:
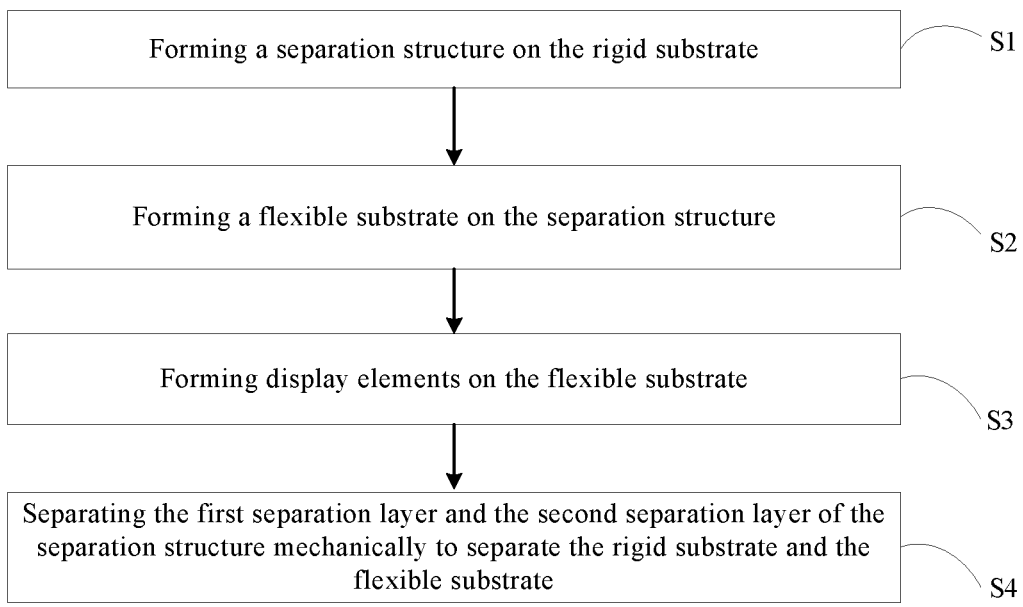
FIG. 1B is a flow chart illustrating a method for fabricating a flexible display substrate according to an embodiment of the present disclosure.
Figure 2:
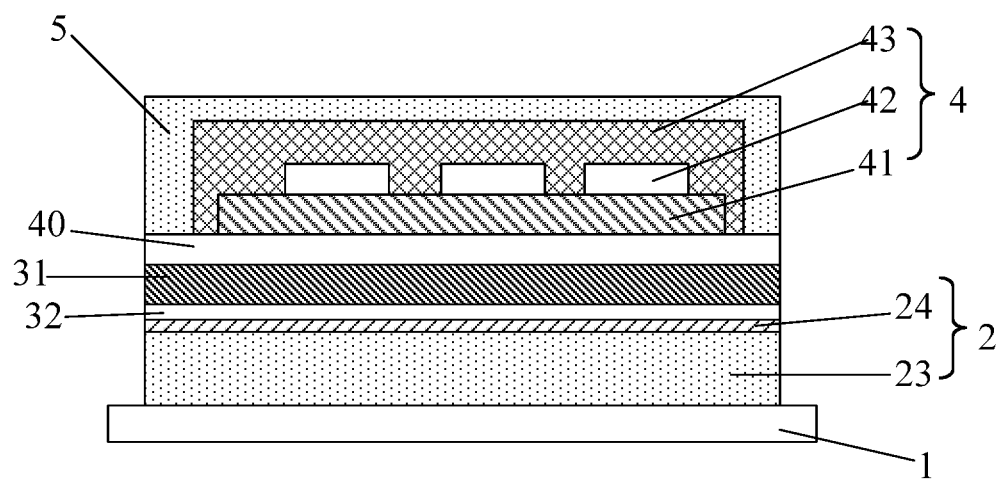
FIG. 2 is a schematic view illustrating a flexible display substrate according to an embodiment of the present disclosure.
Figure 3:
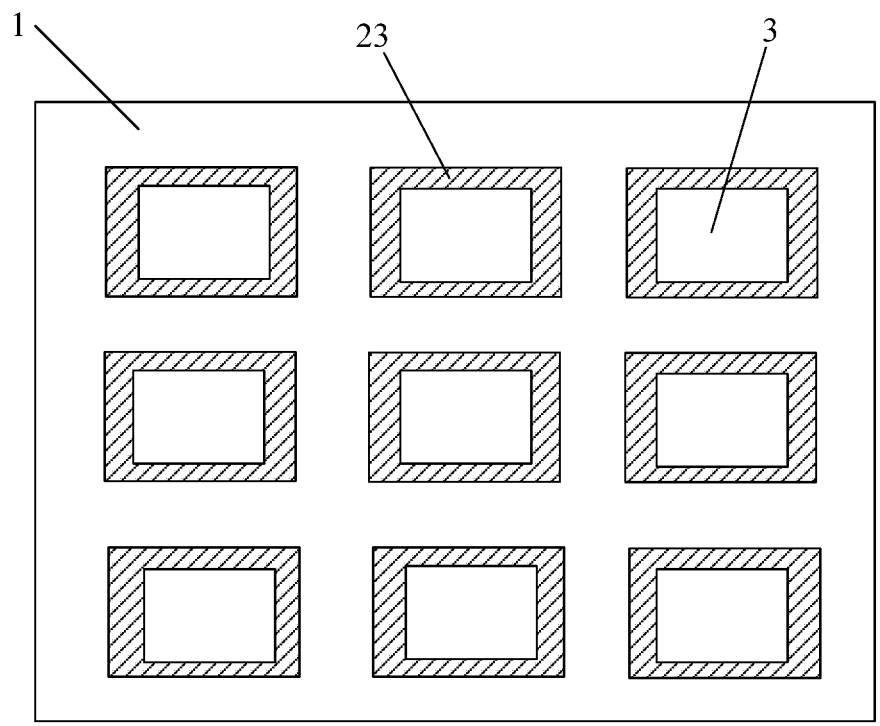
FIG. 3 is a top view illustrating a flexible display substrate according to an embodiment of the present disclosure.

In this regard, an embodiment of the present disclosure provides a method for fabricating a flexible display substrate. As shown in FIGS. 1A and 1B, the method may include forming a separation structure 2 on a rigid substrate 1 (step S1). The separation structure 2 includes a first separation layer 21 and a second separation layer 22, and the first separation layer 21 is formed closer to the rigid substrate 1 than the second separation layer 22. The method may further include forming a flexible substrate 3 on the separation structure 2 (step S2), forming a display element 4 on the flexible substrate 3 (step S3), and separating the first separation layer 21 from the second separation layer 22 mechanically to separate the rigid substrate 1 and the flexible substrate 3 (step S4). The first separation layer 21 and the second separation layer 22 may be easily separated from each other. For example, when the flexible substrate 3 is separated from the rigid substrate 1, an adhesion between the first separation layer 21 and the rigid substrate 1 may be greater than an adhesion between the first separation layer 21 and the second separation layer 22.

In an embodiment, the mechanical separation may be achieved by generating a cut with a laser and applying a pulling force at the cut to separate the first separation layer 21 from the second separation layer 22. For example, the rigid substrate 1 may be fixed and a cut may be generated by using the laser, the cut may extend in a direction perpendicular to the rigid substrate and the cut may not pass through the display element 4, the cut may extend at least to the flexible substrate 3 and extend at most to the first separation layer 21; subsequently, a pulling force may be applied at the cut to separate the first separation layer 21 from the second separation layer 22. For example, the pulling force may be applied at the cut by means of applying adsorption, adhesion, or the like (for example, in a direction perpendicular to the rigid substrate), such that the first separation layer 21 and the second separation layer 22 may be separated from each other.

The method separates the rigid substrate 1 from the flexible substrate 3 by utilizing a property that the first separation layer 21 and the second separation layer 22 of the separation structure 2 are easily be separated from each other mechanically (for example, the adhesion between the first separation layer 21 and the rigid substrate 1 may be greater than the adhesion between the first separation layer 21 and the second separation layer 22). The method is simple in operation, does not require separation by the laser, and does not cause damage to the display substrate.

In an embodiment, the rigid substrate 1 may be a substrate made of glass or any other rigid material, which is not limited herein. A size and a thickness of the rigid substrate 1 are also not limited in embodiments of the present disclosure. It should be noted that, in actual production, a large flexible display mother board may be fabricated first, and after the process in the above method is completed, the large flexible display mother board may be cut into a plurality of small sub-substrates.

In an embodiment, the step of forming the separation structure on the rigid substrate may include: forming the first separation layer on the rigid substrate; and oxidizing the first separation layer at a side distal to the rigid substrate to form the second separation layer.

In an embodiment, the first separation layer may be a molybdenum metal layer and the second separation layer may be a molybdenum oxide layer. Embodiments of the present disclosure may be described below in a case where the first separation layer is a molybdenum metal layer and the second separation layer is a molybdenum oxide layer. However, it should be understood that the first separation layer may also be other suitable metal (for example, tungsten) layer, and the second separation layer may be other suitable metal oxide (for example, tungsten oxide) layer.

Figure 5:
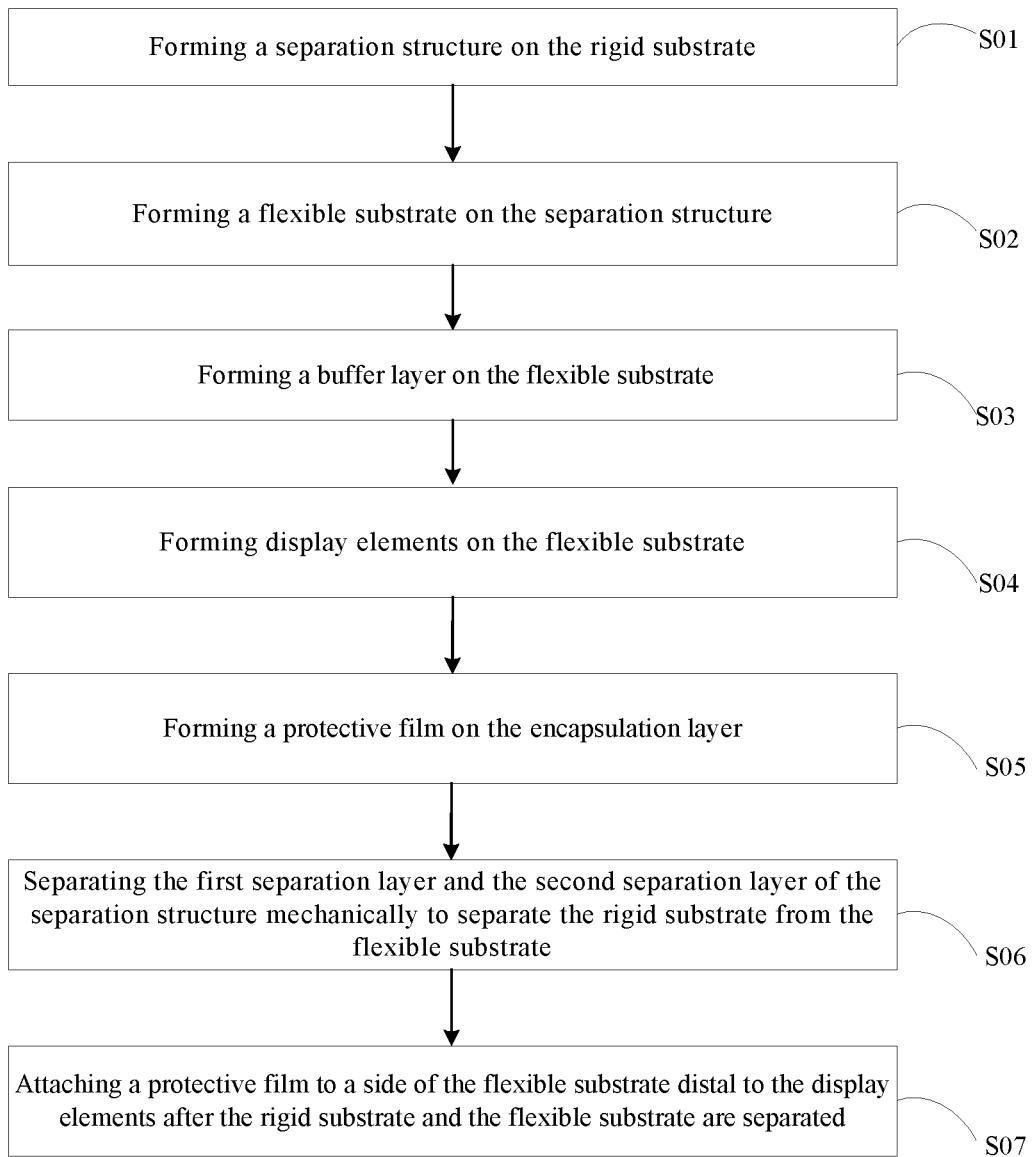
FIG. 5 is a flow chart illustrating a method for fabricating a flexible display substrate according to an embodiment of the present disclosure.

FIG. 5 is a flow chart illustrating a method for fabricating a flexible display substrate according to an embodiment of the present disclosure. As shown in FIG. 5, the method may include the following steps S01-S07.

At step S01, the separation structure 2 is formed on the rigid substrate 1. Step S01 may include the following steps S01a-S01c.

At step S01a, a molybdenum metal layer 23 is formed. Specifically, the molybdenum metal layer 23 may be formed by a process such as PVD, CVD, PECVD, or the like. A thickness of the molybdenum metal layer 23 is not limited herein, and the thickness may be, for example, in a range of 10 nm to 90 mm, and may be adjusted as needed.

Figure 4:
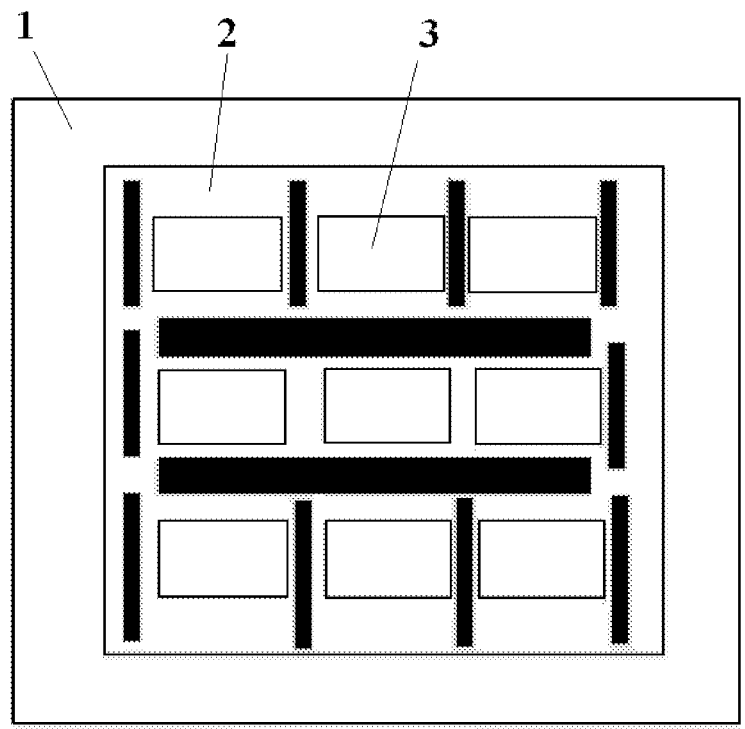
FIG. 4 is a top view illustrating a flexible display substrate according to another embodiment of the present disclosure.

At step S01b, the molybdenum metal layer 23 is patterned. As shown in FIG. 4, an orthographic projection of the flexible substrate 3 on the rigid substrate 1 may fall within an orthographic projection of the patterned molybdenum metal layer 23 on the rigid substrate 1. Black strips shown in FIG. 4 are locations where the molybdenum metal layer is punctured (hollowed). Patterning the molybdenum metal layer 23 can reduce an adverse effect on a process chamber in subsequent fabrication of the display element 4. It should be understood that the patterned molybdenum metal layer 23 may be a patterned monolithic structure.

At step S01c, the molybdenum metal layer 23 is oxidized at a side distal to the rigid substrate 1 to form a molybdenum oxide film (layer) 24, a part of the molybdenum metal layer 23 which is not oxidized serves as the first separation layer 21, and the molybdenum oxide film 24 serves as the second separation layer 22. Specifically, the molybdenum metal layer 23 may be placed at a high temperature, for example, at 300° C. to 380° C., and more specifically, at 350° C. for example, and oxidized under an atmosphere of air to form a layer of MoOx (molybdenum oxide) on a surface thereof. It should be noted that the molybdenum oxide in embodiments of the present disclosure includes molybdenum trioxide, molybdenum dioxide, and the like.

In an embodiment, the molybdenum oxide film 24 has a thickness of 10 to 100 angstroms. The molybdenum oxide film 24 may be very thin, such as having a thickness of 10 to 100 angstroms, so the presence of the molybdenum oxide film 24 has no effect on the flexible product itself.

At step S02, a flexible substrate 3 is formed on the separation structure 2.

In an embodiment, the step of forming the flexible substrate 3 on the separation structure 2 may include steps S02a-S02b.

At step S02a, an adjustment layer 32 having a thickness of, for example, 10 angstroms to 800 angstroms may be formed by deposition by using an inorganic insulating material. The adjustment layer 32 may avoid damage to the organic flexible material during the mechanical separation. The adjustment layer 32 may also be in contact with the molybdenum oxide film 24, and thus, the adjustment layer 32 may be configured to, for example, adjust an amount of force required for the mechanical separation during the subsequent mechanical separation process.

In an embodiment, the inorganic insulating material includes silicon oxide or silicon nitride.

The adjustment layer 32 may be relatively thin, for example, having a thickness of 10 angstroms to 800 angstroms, thus it has no effect on the flexible product itself.

At step S02b, the flexible substrate 31 is made of an organic material. A specific material of the flexible substrate 31 is not limited in embodiments of the present disclosure, and may be selected according to actual requirements.

Howe to prepare the flexible substrate 31 is not limited in embodiments of the present disclosure, and may be selected or changed according to the organic material itself. In an embodiment, the flexible substrate 31 may be formed by coating a polyimide solution.

A specific thickness and size of the flexible substrate 31 are not limited in embodiments of the present disclosure, and may be designed according to actual requirements of the product. For example, the flexible substrate 31 may have a thickness of 10-20 μm.

At step S03, a buffer layer 40 is formed on the flexible substrate 3. Specifically, the buffer layer 40 may be formed by a plasma enhanced chemical vapor deposition method, a low pressure chemical vapor deposition method, an atmospheric pressure chemical vapor deposition method, an electron cyclotron resonance chemical vapor deposition method, or a sputtering method. A specific thickness and size of the buffer layer 40 are not limited in embodiments of the present disclosure, and may be changed according to actual requirements of the product.

At step S04, the display element 4 is formed on the flexible substrate 3.

In an embodiment, the flexible display substrate is a flexible OLED display substrate, and the step of forming the display element 4 on the flexible substrate 3 may include the following steps S04a-S04c.

At step S04a, a TFT array structure 41 is formed. Specifically, a TFT may include a gate metal pattern, a gate insulating layer, an active layer, and a source-drain metal pattern which are sequentially formed. The gate metal pattern may be fabricated from metal molybdenum and may have a thickness of 200 nm; the gate insulating layer may be fabricated from silicon dioxide (SiO2) and may have a thickness of 150 nm; the active layer may be fabricated from indium gallium zinc oxide, and may have a thickness of 40 nm; and the source-drain metal pattern may be fabricated from metal molybdenum and may have a thickness of 200 nm.

At step S04b, an organic light emitting device 42 is formed. Specifically, forming the organic light emitting device 42 may include forming an anode and a cathode, and a light emitting functional layer between the anode and the cathode. Forming the light-emitting functional layer may include forming a Hole Injection Layer (HIL), a Hole Transport Layer (HTL), an Emitting Material Layer (EML), and an Electro Transport Layer (ETL) and an Electron Injection Layer (EIL).

At step S04c, an encapsulation layer 43 is formed. Specifically, the encapsulation layer 43 may be multi-layered and may be formed by using an organic material and an inorganic material alternately. More specifically, the encapsulation layer 43 of an inorganic material may be formed by a process such as chemical vapor deposition, plasma enhanced chemical vapor deposition, or the like, and the encapsulation layer 43 of an organic material may be formed by an inkjet printing process.

At step S05, a protective film 5 (TPF) is formed on the encapsulation layer 43. That is, a layer of TPF with small stickiness may be attached.

At step S06, the first separation layer 21 and the second separation layer 22 of the separation structure 2 are mechanically separated to separate the rigid substrate 1 from the flexible substrate 3. In the mechanical separation process, the adhesion between the first separation layer 21 and the rigid substrate 1 may be greater than the adhesion between the first separation layer 21 and the second separation layer 22. When performing the mechanical separation, the cut described above may pass through the protective film 5 without passing through the display elements 4.

A product subjected to the above steps may be tested by a tester for the mechanical separation. In a case where a width of the product for test is 2.5 cm, a separation speed is 300 mm/min, and a separation angle is 180°, a separation force between the molybdenum oxide layer and the metal molybdenum layer is between 0.2 gf/mm and 0.8 gf/mm, and more specifically, the separation force may be 0.5 gf/mm (gram force/mm).

Figure 6:
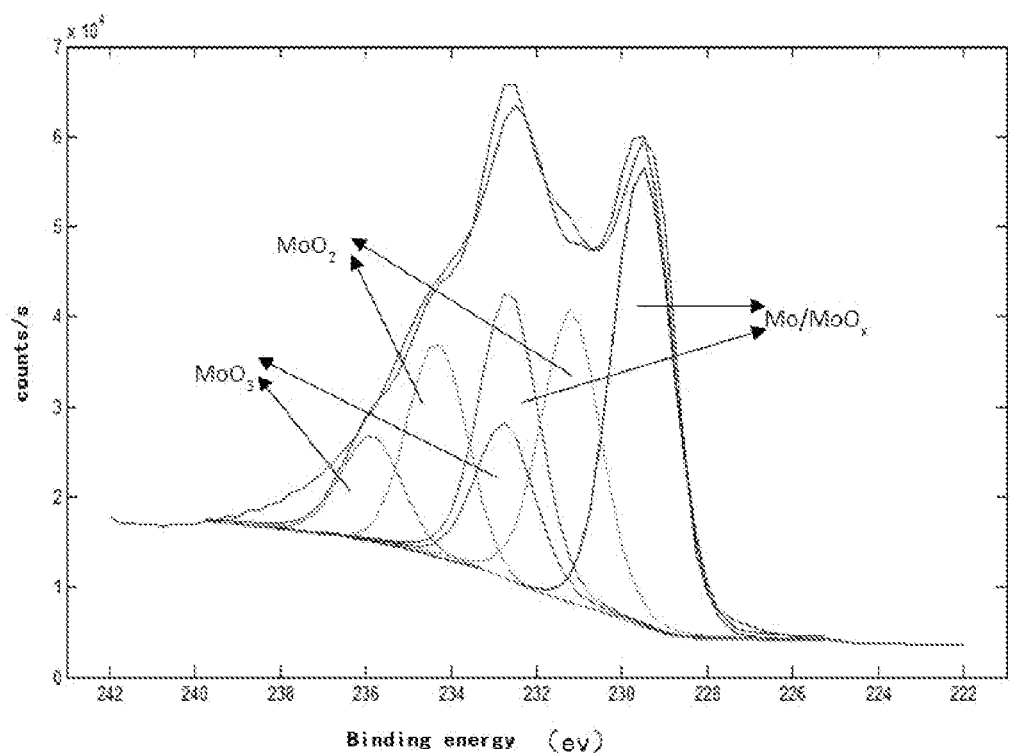
FIG. 6 is a schematic view illustrating XPS analysis of a rigid substrate side after separation of a flexible display substrate according to an embodiment of the present disclosure.
Figure 7:
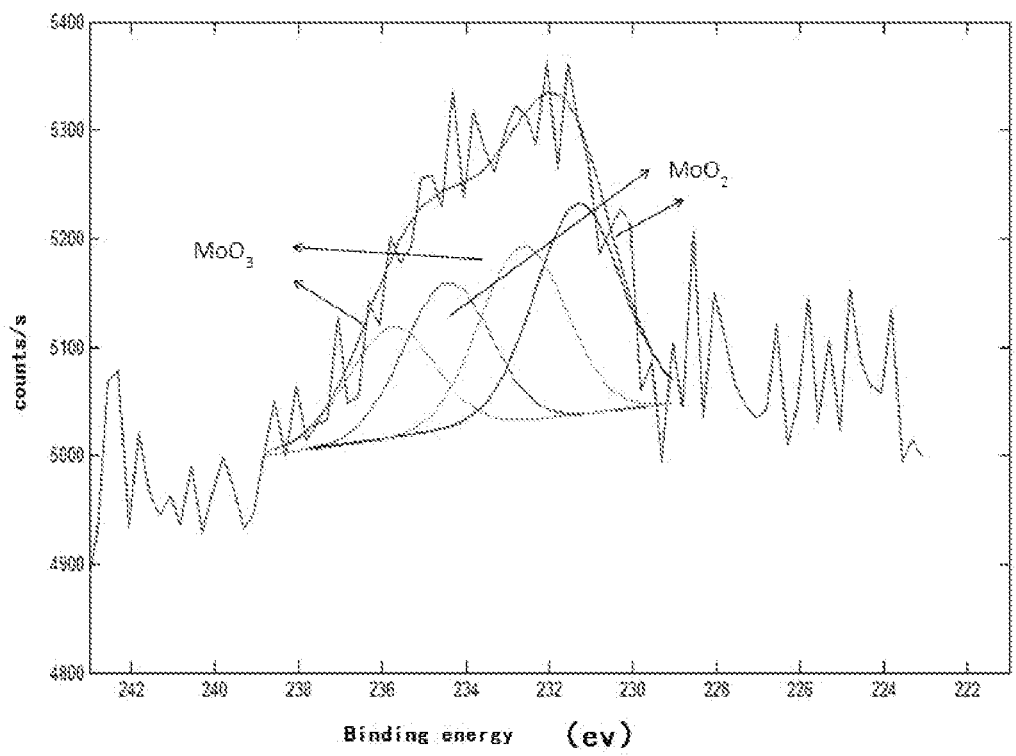
FIG. 7 is a schematic view illustrating XPS analysis of a flexible substrate side after separation of a flexible display substrate according to an embodiment of the present disclosure.

The rigid substrate 1 and the flexible substrate 3 after separation may be subjected to a component XPS analysis test. FIG. 6 is a schematic view illustrating XPS analysis of a rigid substrate side after separation of a flexible display substrate according to an embodiment of the present disclosure; and FIG. 7 is a schematic view illustrating XPS analysis of a flexible substrate side after separation of a flexible display substrate according to an embodiment of the present disclosure. It can be seen from FIG. 6 and FIG. 7 that metal molybdenum and molybdenum oxide are detected on an upper surface of the rigid substrate 1, and only molybdenum oxide is detected on a lower surface of the flexible substrate 3 while metal molybdenum is not detected on the lower surface of the flexible substrate 3 at all. Thus, the molybdenum metal layer 23 and the molybdenum oxide film 24 are effectively separated from each other.

At step S07, after the rigid substrate 1 and the flexible substrate 3 are separated from each other, a protective film is attached to the flexible substrate 3 at a side distal to the display element 4.

It should be noted that the size, thickness, and the like of the respective structural layers shown in the drawings corresponding to embodiments of the present disclosure are merely illustrative. In an embodiment, a projected area of each structural layer on the substrate may be the same or different.

An embodiment of the present disclosure further provides a display device including a display substrate fabricated according to the method of any embodiment described above. The display device may be any product or component having a display function, such as an electronic paper, an OLED panel, a mobile phone, a tablet computer, a television, a display, a notebook, a digital photo frame, a navigator, and the like.

It can be understood that the foregoing embodiments are merely exemplary embodiments used for describing the principle of the present disclosure, but the present disclosure is not limited thereto. Those ordinary skilled in the art may make various variations and improvements without departing from the spirit and essence of the present disclosure, and these variations and improvements shall fall into the protection scope of the present disclosure.

What is claimed is:

1. A method for fabricating a flexible display substrate, comprising steps of:
forming a separation structure on a rigid substrate, the separation structure comprising a first separation layer and a second separation layer, the first separation layer being formed closer to the rigid substrate than the second separation layer;
forming a flexible substrate on the separation structure;
forming a display element on the flexible substrate; and
separating the first separation layer and the second separation layer of the separation structure from each other mechanically to separate the rigid substrate from the flexible substrate,
wherein the step of separating the first separation layer and the second separation layer of the separation structure from each other mechanically comprises generating a cut by a laser such that the cut extends along a direction perpendicular to the rigid substrate, and applying a pulling force at the cut to separate the first separation layer from the second separation layer.

2. The method for fabricating the flexible display substrate of claim 1, wherein the step of forming the separation structure on the rigid substrate comprises:
forming the first separation layer on the rigid substrate; and
oxidizing a surface of the first separation layer distal to the rigid substrate to form the second separation layer.

3. The method of manufacturing the flexible display substrate of claim 2, wherein the first separation layer is a molybdenum metal layer, and the second separation layer is a molybdenum oxide layer.

4. The method of manufacturing the flexible display substrate of claim 3, wherein the molybdenum oxide layer has a thickness in a range of 10 to 100 angstroms.

5. The method of manufacturing the flexible display substrate of claim 2, wherein the step of forming the flexible substrate on the separation structure comprises:
forming an adjustment layer on the second separation layer, and forming the flexible substrate on the adjustment layer.

6. The method of manufacturing the flexible display substrate of claim 5, wherein the adjustment layer is made of an inorganic insulating material.

7. The method of manufacturing the flexible display substrate of claim 6, wherein the inorganic insulating material comprises silicon oxide or silicon nitride.

8. The method of manufacturing the flexible display substrate of claim 7, wherein the adjustment layer has a thickness in a range of 10 to 800 angstroms.

9. The method of manufacturing the flexible display substrate of claim 5, wherein the flexible substrate is made of an organic material.

10. The method of manufacturing the flexible display substrate of claim 9, wherein the flexible substrate is formed by coating a polyimide solution.

11. The method of manufacturing the flexible display substrate of claim 10, wherein the flexible substrate has a thickness in a range of 10 to 20 µm.

12. The method of manufacturing the flexible display substrate of claim 1, wherein the flexible display substrate is a flexible OLED display substrate, and the step of forming a display element on the flexible substrate comprises:
forming a TFT array structure, an organic light emitting device, and an encapsulation layer on the flexible substrate.

13. A method for fabricating a flexible display substrate, comprising steps of:
forming a separation structure on a rigid substrate, the separation structure comprising a first separation layer and a second separation layer, the first separation layer being formed closer to the rigid substrate than the second separation layer;
forming a flexible substrate on the separation structure;
forming a display element on the flexible substrate; and
separating the first separation layer and the second separation layer of the separation structure from each other mechanically to separate the rigid substrate from the flexible substrate,
wherein the step of forming the separation structure on the rigid substrate comprises:
forming the first separation layer on the rigid substrate; and
oxidizing a surface of the first separation layer distal to the rigid substrate to form the second separation layer,
wherein before the step of oxidizing the surface of the first separation layer distal to the rigid substrate to form the second separation layer, the method further comprising:
patterning the first separation layer such that an orthographic projection of the flexible substrate on the rigid substrate falls within an orthographic projection of the patterned first separation layer to the rigid substrate.

14. The method of manufacturing the flexible display substrate of claim 13, wherein the first separation layer is a molybdenum metal layer, and the second separation layer is a molybdenum oxide layer.

15. The method of manufacturing the flexible display substrate of claim 14, wherein the molybdenum oxide layer has a thickness in a range of 10 to 100 angstroms.

16. The method of manufacturing the flexible display substrate of claim 13, wherein the step of forming the flexible substrate on the separation structure comprises:
forming an adjustment layer on the second separation layer, and forming the flexible substrate on the adjustment layer.

17. The method of manufacturing the flexible display substrate of claim 16, wherein the adjustment layer is made of an inorganic insulating material.

18. The method of manufacturing the flexible display substrate of claim 17, wherein the inorganic insulating material comprises silicon oxide or silicon nitride.

19. The method of manufacturing the flexible display substrate of claim 18, wherein the adjustment layer has a thickness in a range of 10 to 800 angstroms.

20. A method for fabricating a flexible display substrate, comprising steps of:
forming a separation structure on a rigid substrate, the separation structure comprising a first separation layer and a second separation layer, the first separation layer being formed closer to the rigid substrate than the second separation layer;
forming a flexible substrate on the separation structure;
forming a display element on the flexible substrate; and
separating the first separation layer and the second separation layer of the separation structure from each other mechanically to separate the rigid substrate from the flexible substrate, wherein after the step of separating the first separation layer and the second separation layer of the separation structure from each other mechanically to separate the rigid substrate from the flexible substrate, the method further comprising:

attaching a protective film to a side of the flexible substrate distal to the display element.

* * * * *